United States Patent
Spychalski-Merle et al.

(10) Patent No.: US 6,590,189 B2
(45) Date of Patent: Jul. 8, 2003

(54) METHOD OF MEASURING A WELDING VOLTAGE AT A HEATING COIL OF A HEATING COIL FITTING AND A HEATING COIL WELDING APPARATUS

(75) Inventors: Achim Spychalski-Merle, Alsfeld (DE); Bernd Merle, Alsfeld (DE)

(73) Assignee: PF-Schweisstechnologie GmbH, Alsfeld (DE)

(*) Notice: Subject to any disclaimer, the term of this patent is extended or adjusted under 35 U.S.C. 154(b) by 0 days.

(21) Appl. No.: 09/921,047

(22) Filed: Aug. 2, 2001

(65) Prior Publication Data

US 2002/0036198 A1 Mar. 28, 2002

(30) Foreign Application Priority Data

Aug. 10, 2000 (DE) .......................... 100 39 192

(51) Int. Cl.[7] ................................. H05B 1/02
(52) U.S. Cl. .................. 219/497; 219/535; 219/544; 219/505; 285/21.2; 285/286
(58) Field of Search .................. 219/497, 501, 219/505, 499, 544, 535, 541; 392/480, 479; 285/292, 21.2, 286

(56) References Cited

U.S. PATENT DOCUMENTS

| | | | | |
|---|---|---|---|---|
| 4,486,650 A | * | 12/1984 | Bridgstock et al. | 219/544 |
| 4,943,706 A | * | 7/1990 | Lyall et al. | 219/494 |
| 5,141,580 A | * | 8/1992 | Dufour et al. | 156/158 |
| 5,170,042 A | * | 12/1992 | Bunn | 219/497 |
| 5,408,577 A | * | 4/1995 | Weber, Jr. et al. | 392/480 |

FOREIGN PATENT DOCUMENTS

| | | |
|---|---|---|
| DE | 24 15 486 B2 | 10/1974 |
| DE | 26 37 894 B2 | 3/1978 |
| DE | 40 09 286 A1 | 9/1991 |
| EP | 0 076 043 B1 | 1/1986 |
| EP | 0 258 827 B1 | 6/1992 |
| GB | 2 137 026 A | 9/1984 |
| JP | 62-273441 A | 11/1987 |
| JP | 63-037248 A | 2/1988 |
| JP | 3-047737 | 2/1991 |
| JP | 5-052288 | 3/1993 |
| JP | 7-16930 | 1/1995 |
| JP | 11-216777 | 8/1999 |
| JP | 11-291355 | 10/1999 |

OTHER PUBLICATIONS

ANON., "Taschenbuch fuer Elektomesstechnik," Siemens & Halske AG (Germany), p. 112–114, (Mar. 27, 1964).

* cited by examiner

Primary Examiner—Mark Paschall
(74) Attorney, Agent, or Firm—Hahn Loeser + Parks LLP; Stephen L. Grant

(57) ABSTRACT

In a method and apparatus for measuring the welding voltage at the heating coil of a heating coil fitting a welding current supply unit is connected to the connecting elements of the heating coil fitting by way of connecting lines and junction elements, and the welding voltage is detected by means of a voltage measurement unit. The welding voltage is detected at a respective contact of each of the two connecting elements of the heating coil fitting in electrically insulated relationship with respect to the connecting lines and the junction elements.

12 Claims, 2 Drawing Sheets

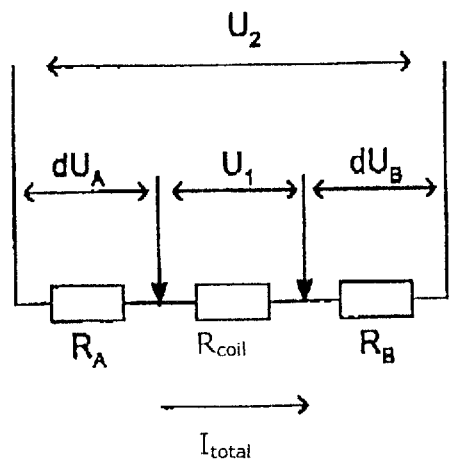

Fig. 2

| | |
|---|---|
| $U_1$: | Measured voltage between the measurement tips |
| $U_2$: | Measured voltage at the contacts (supply line) |
| $R_A$: | Transfer resistance at first contact |
| $dU_A$: | Voltage drop at the transfer resistance of the first contact |
| $R_B$: | Transfer resistance at the second contact |
| $dU_B$: | Voltage drop at the transfer resistance of the second contact |
| $R_{coil}$: | Resistance of the heating coil |
| $I_{total}$: | Total current through the heating coil |

METHOD OF MEASURING A WELDING VOLTAGE AT A HEATING COIL OF A HEATING COIL FITTING AND A HEATING COIL WELDING APPARATUS

FIELD OF THE INVENTION

The present invention generally concerns a method of measuring a welding voltage at a heating coil of a heating coil fitting and a heating coil welding apparatus which can be used for carrying out the method.

BACKGROUND OF THE INVENTION

In order to sealingly connect installation components of plastic material, such as for example pipes and tubes, use is made in a practical context of heating coil fittings. Heating coil fittings comprise a fitting tube which is made from plastic material, with at least one heating coil disposed in the wall of the tube. The heating coil can be connected to an electrical welding current supply unit by way of two connecting ends which are taken to the outside of the fitting tube and which terminate in connecting elements. For the purposes of welding the two installation tubes of plastic material, they are introduced into the fitting tube which is of an inside diameter that is slightly larger than the outside diameter of the two tubes which are to be connected together. An electrical current is then supplied to the heating coil. In that case, the energy supplied is converted into heat as a consequence of the electrical resistance inherent in the heating coil. The heat produced in that way, originating from the heating coil, penetrates slowly through the plastic materials of the fitting tube and the installation tubes to be welded together. When the softening point or the melting range of the materials involved is exceeded, the materials plasticise or soften and flow together. When the materials then cool down they harden to form a connection between the two tubes and the fitting, which affords gas-tight and liquid-tight sealing integrity. The terms 'heating coil welding' or just 'welding' are also frequently employed to denote that procedure.

In one form of a heating coil welding procedure, the welding voltage which is applied to the heating coil is kept constant over the duration of the welding process by way of the welding current supply unit. In practice the welding voltage is generally not measured at the equipment end, that is to say at the ends of the connecting lines at the welding current supply unit, but by way of a separate measurement line, at a position adjacent the heating coil, at the connecting elements which are mounted to the ends of the connecting lines connecting the heating coil to the welding current supply unit. That obviates involvement of the voltage drop at the connecting lines, in order to determine the actual voltage at the heating coil, at the end of the connecting lines connected thereto.

The quality of a welded joint can be seriously reduced by virtue of dirty or worn junction elements or the contacts disposed therein, as then a part of the voltage is dropped off at the resistance to current flow at the contact. A contact with a higher resistance in that way is heated up to a much greater degree than a contact involving a lower level of resistance. At the same time the fitting receives a level of heating output which is reduced by that which is dropped off at the contact, and which reduces the quality of the weld produced.

The cause of this is that the welding current supply unit or a voltage measuring unit disposed therein measures or regulates the welding voltage at the junction elements of the connection lines, with which the welding current supply unit is connected to the actual connecting elements of the heating coil fitting, and thus cannot take appropriate account of the resistance to current flow at the contact. Accordingly, an excessively low voltage occurs at the heating coil of the fitting, depending on the respective degree of wear or contamination of the contacts in the respective junction elements of the connecting lines or connecting elements of the heating coil fitting. Contamination at the contacts can be for example dirt, dust or plastic material which has flowed thereinto, but also an oxidation layer which is formed on the contact of the junction elements and/or the connecting elements of the heating coil fitting.

Other control procedures in this respect make use of the power or the current involved, as a regulating parameter, or follow fixedly predetermined regulating curves. In any case the precise value of the welding voltage applied to the heating coil is always required.

A further method of measuring the welding voltage at the heating coil in this respect provides for direct measurement of the temperature of the heating coil by means of the temperature dependency of the material of the heating coil. It will be apparent that, to achieve that, the resistance of the heating coil must be measured with a high degree of accuracy prior to and during the welding operation. An excessively high level of resistance to current flow, which is moreover temperature-dependent, means however that such a regulating procedure is generally excessively inaccurate.

Finally, in a practical context, it is also possible to fit a measurement tip or probe to a contact of one of the two connecting elements at the heating coil fitting, by which it is connected to the welding current supply unit, in monitoring the heating coil welding procedure. Incorporated in that contact of the heating coil fitting is a reference resistance which can be read off with the measuring tip. The resistance value ascertained in that way is converted by way of a table into a welding time. The measuring tip is therefore in this case a part of an automatic system for reading off the welding parameters.

SUMMARY OF THE INVENTION

An object of the present invention is to provide a method of measuring a welding voltage at a heating coil of a heating coil fitting, which permits the welding voltage applied to the welding coil to be precisely detected, independently of influencing parameters such as corrosion and the like.

Another object of the present invention is to provide a method of measuring a welding voltage at a heating coil fitting, which can provide for precise monitoring and control of the welding voltage in such a way as to optimise the welding procedure.

Yet another object of the present invention is to provide a heating coil welding apparatus which is designed to precisely ascertain the welding voltage at the heating coil to afford reliable control of the welding procedure.

In accordance with the principles of the present invention in the method aspect the foregoing and other objects are attained by a method of measuring a welding voltage at a heating coil of a heating coil fitting, in which a welding current supply unit is connected by way of connecting lines and junction elements to the connecting elements of the heating coil fitting. The welding voltage is then detected by means of a measurement unit. The welding voltage is taken off at a respective contact of the two connecting elements of the heating coil fitting electrically insulatedly from the connecting lines and the junction elements.

As will be noted from the description hereinafter of a preferred embodiment of the invention, the fact that the welding voltage is taken off at a respective contact of each of the two connecting elements of the heating coil fitting means that influences which are caused for example by corrosion at the contact surfaces in the junction elements of the welding current supply unit can have no effect. In that way the welding voltage at the heating coil can be reliably and accurately ascertained and it is thus possible to achieve an optimum welding process. In order to exclude influences arising out of the connecting lines and the junction elements when measuring the welding voltage, it is advantageous if the measurement procedure is implemented in electrical isolation from the connecting lines, with the measuring elements being electrically insulated from the connecting lines and the junction elements respectively.

Detecting the welding voltage at the contact of the connecting elements and detecting a further voltage value at the connecting lines affords the possibility of detecting the drop in voltage as a result of the transfer resistance or resistance to current flow at the contacts.

In order to ensure reliable contact in terms of the measurement procedure in a preferred feature of the invention the welding voltage is detected by means of measurement elements which are reversibly acted upon by a force in the direction of the respective contact of the connecting element. For example that force can be a spring force. That affords the possibility of the measurement element being able to penetrate a deposit which may have formed on the respective contact of the connecting elements.

It may further be found to be advantageous if the measurement operation is effected at least approximately in a current-less mode as the transfer resistance is dependent on the contact surface area and the measurement current passing through the arrangement. Thus, even in the case of a small contact surface area, the transfer resistance is vanishingly low with a low current while it assumes a crucial value with the same contact surface area and a high current, for example the welding current, by virtue of the high current density in relation to surface area. Approximately current-less measurement can be effected for example by the input resistance of the measurement unit being high.

Further in accordance with the principles of the invention in the apparatus aspect a heating coil welding apparatus, for example for carrying out the method according to the invention, comprises at least one welding current supply unit and at least first and second connecting lines which are connected to the welding current supply unit and which each have a respective junction element. The welding current supply unit can be releasably connected by way of the connecting lines to connecting elements of at least one heating coil fitting. The apparatus further includes a measurement unit for detecting at least the welding voltage, a respective first measurement line going from the measurement unit to the junction element of each one of the connecting lines. Each junction element has at least one measurement element which is respectively connected to the first measurement line and which can be brought into electrically conductive contact with a contact of a connecting element of the heating coil fitting to detect the welding voltage in electrically insulated relationship from the respective connecting line and junction element.

As a further measure for ensuring that good contact is made between the measurement element and the contact of the respective connecting element, in a preferred feature of the invention the measurement element may have a measurement tip which is adapted to be brought into contact with the contact of the connecting member. That measuring tip assists with penetration of any deposits which may be present at the contacts of the connecting elements.

Further objects, features and advantages of the invention will be apparent from the description hereinafter of a preferred embodiment.

BRIEF DESCRIPTION OF THE DRAWING

The invention will be better understood when reference is made to the accompanying drawings, wherein identical parts are identified by identical reference numbers and wherein:

FIG. 2 is an equivalent diagram of the heating coil welding apparatus shown in FIG. 1.

DESCRIPTION OF THE PREFERRED EMBODIMENT

Figure 1:
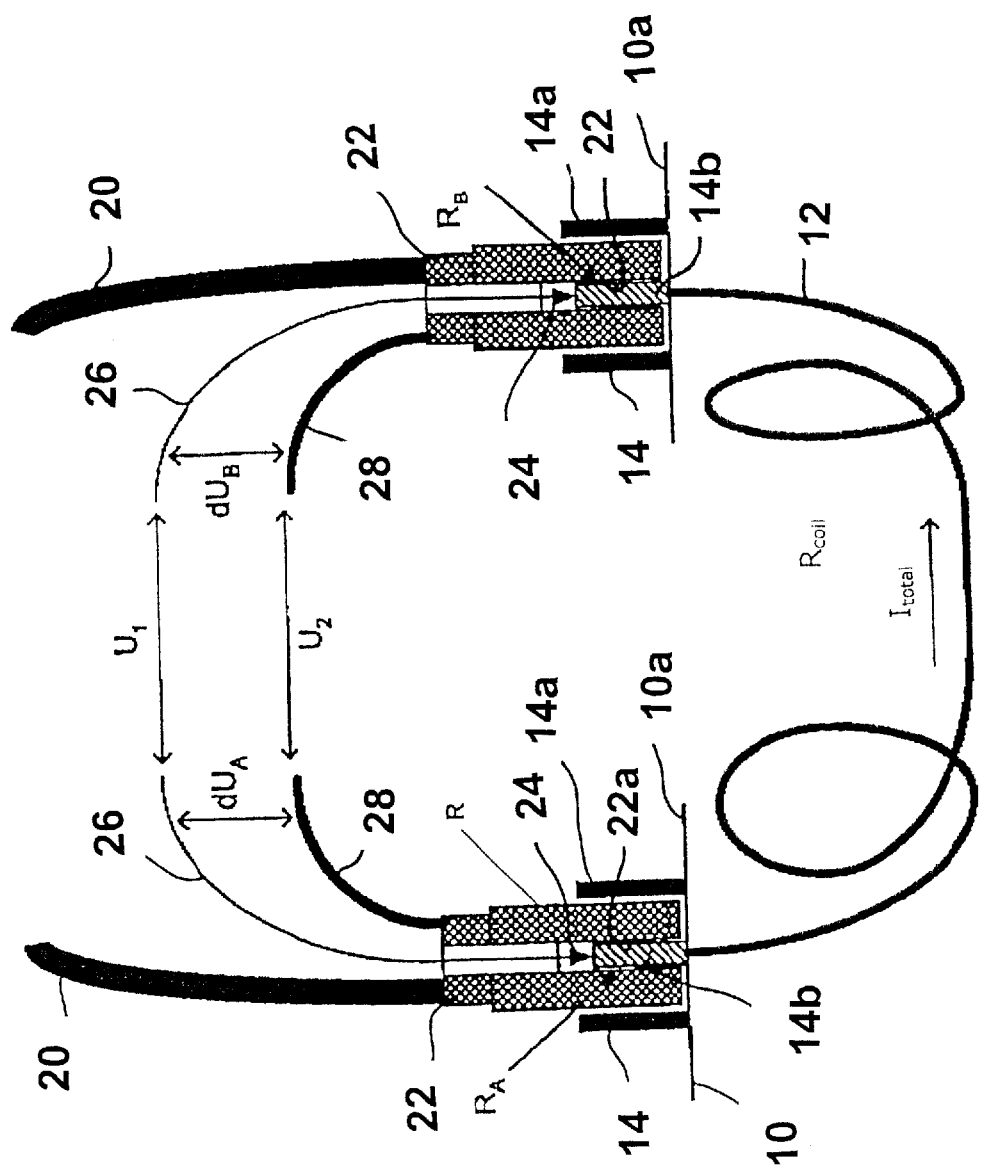
FIG. 1 is a diagrammatic view of a heating coil welding apparatus according to the invention.

It is first noted that directional terms such as left, right, top and bottom used herein relate to the Figures of the drawing in such a position that references therein can be read in the normal fashion.

Referring first to FIG. 1, diagrammatically shown therein is the connecting region of a heating coil fitting which is generally indicated at 10 and which is made from a plastic material suitable for welding two plastic tubes (not shown). The heating coil fitting 10 comprises a heating coil 12 of which only two turns are shown and which is formed from a resistance heating wire. The two ends of the heating coil 12 are passed through the outside wall 10a of the heating coil fitting 10 and terminate in two connecting elements 14. The connecting elements 14 are in the form of cylindrical bushes or sockets which project radially outwardly from the outside wall 10a of the heating coil fitting 10 and each have a tubular portion 14a. Arranged centrally in the interior of each of the tubular portions 14a is a respective one of the connecting ends of the heating coil 12, which end is there in the form of a contact formed by a connecting pin 14b comprising a suitable material, for example brass. The radial length of the connecting pins 14b is identical but shorter than the radial extent of the tubular portion 14a.

Two connecting lines 20 are provided for electrically connecting the heating coil 12 to a welding current supply unit (not shown). The connecting lines 20 each terminate in a respective junction element 22 which is in the form of a cylindrical plug member. The junction element 22 is of an outside diameter which approximately corresponds to the inside diameter of a connecting element 14 so that the junction element 22 can be inserted by hand into the corresponding connecting element 14 and removed again therefrom.

At the front free end, being the end which is downward in FIG. 1, each junction element 22 is provided with a bush or socket indicated at 22a of an electrically conductive material, such as for example silver-plated brass, into which a connecting projection 14b engages when the plug member is inserted. In this arrangement the inside diameter of the socket 22a approximately corresponds to the outside diameter of the connecting projection 14b so that, when the connecting projection 14b is introduced into the socket 22a, an electrical connection is made between the welding current supply unit and the heating coil 12.

Disposed in the interior of each connecting element 22 is a respective electrically conductive measurement tip 24 which, in the illustrated embodiment, is in contact with the end face of the connecting projection 14b. Each measurement tip 24 is electrically conductively connected by way of a respective first measurement line 26 to a measurement unit (not shown) for measurement of the welding voltage, which measurement unit can be separate from the welding current supply unit or can be in the form of part thereof. The measurement unit has a high-resistance input so that measurement is effected at least approximately in a current-less mode.

As can be seen from FIG. 1, the measurement tip 24 and the first measurement line 26 do not involve any connection to the junction element 22 or to the connecting line 20. In other words, the measurement tip 24 and the first measurement line 26 are electrically insulated by air or a suitable electrical insulator from the respective connecting line 20 and the junction element 22, so that the measurement tip 24 detects only the voltage at the connecting projection 14b. That electrical insulation can possibly be still further increased by additional measures such as the provision of insulating material between the measurement tip 24 and/or the first measurement line 26 and the junction element 22 and/or the connecting line 20.

It is further optionally possible to provide two second measurement lines as indicated at 28 which on the one hand are respectively electrically conductively connected to the two junction elements 22 and on the other hand to the measurement unit for detecting the welding voltage. Therefore the voltage at the junction elements 22 can also be detected by means of those two measurement lines 28.

Reference will now be made to FIG. 2 showing that it is possible to detect the values $U_1$, $U_2$, $dU_A$, $dU_B$ and $I_{total}$. Here $U_1$ denotes the measured voltage between the measurement tips 24, $U_2$ denotes the measured voltage at the junction elements 22, or at the contacts of the power supply line, $dU_A$ denotes the voltage drop as a consequence of the passage or transfer resistance between the socket 22a and the connecting projection 14b of the left-hand connecting configuration, $dU_B$ denotes the voltage drop as a result of the passage or transfer resistance between the socket 22a and the connecting projection 14b of the right-hand connection configuration, and $I_{total}$ denotes the total current through the heating coil 12. Those values can be used to derive the following values by calculation operations by means of software or by a suitably wired board:

welding voltage at the heating coil:

$$U_{coil}=U_1=U_2-dU_A-dU_B$$

resistance of the heating coil:

$$R_{coil}=U_{coil}/I_{total}=U_1/I_{total}$$

That means that the relevant values are adequately defined. Furthermore the following arise out of the data involved:

power loss at the contacts:

$$P_{A+B}=(dU_A+dU_B)*I_{total}$$

transfer resistance:

$$R_{A+B}=(dU_A+dU_B)/I_{total}$$

The values which are newly available by virtue of the structure according to the invention of a heating coil welding apparatus permit more accurate regulation of the welding procedure. In addition, losses due to the transfer resistances or resistances involved in current flow, between a respective socket 22a and connecting projection 14b, can be compensated within certain limits by virtue of a higher voltage or a longer welding time. It will be noted however that if a certain level of power loss is exceeded the welding procedure must be broken off as being defective in order to guarantee appropriate quality of the weld made.

In the case of direct temperature control the arrangement of the measurement tips 24 first makes the method a viable proposition as without it the transfer resistance would be involved directly in the regulating temperature.

It is also to be noted that the connecting elements used may also be in the form of clamp-type terminal connections, square pins and the like.

It will be appreciated that the above-described method and apparatus according to the invention have been set forth solely by way of example and illustration of the principles thereof and that various modifications and alterations may be made therein without departing from the spirit and scope of the invention

What is claimed is:

1. A method of measuring a welding voltage at a heating coil of a heating coil fitting which includes connecting elements for connection to a welding current supply unit by way of connecting lines and junction elements, wherein the welding voltage is taken off at a respective contact of each of the two connecting elements of the heating coil fitting electrically insulatedly from the connecting lines and the junction elements, and the welding voltage is detected by means of a measurement unit.

2. The method as set forth in claim 1 wherein the welding voltage is taken off at the contact of the connecting elements and a further voltage value is taken off at the connecting lines.

3. The method as set forth in claim 1 wherein the welding voltage is detected by means of measurement elements which are reversibly acted upon by a force in the direction of the contact of the connecting elements.

4. The method as set forth in claim 1 wherein measurement is effected at least approximately in a current-less mode.

5. A heating coil welding apparatus comprising at least one welding current supply unit, at least first and second connecting lines for connection to the welding current supply unit and each having a respective junction element, at least one heating coil fitting including connecting elements, the elements being releasably connectable to the welding current supply unit by way of said connecting lines a measurement unit for detecting at least the welding voltage, and a respective first measurement line from the measurement unit to the junction element to one of the connecting lines, wherein each junction element has at least one measurement element for connection to the respective first measurement line and operable to be brought into electrically conductive contact with a contact of a connecting element of the heating coil fitting to detect the welding voltage in electrically insulated relationship from the connecting line and the junction element.

6. The apparatus as set forth in claim 5 including means for urging the measurement element towards the contact of the connecting element.

7. The apparatus as set forth in claim 6
wherein said means urging said measurement element towards the contact of the connecting element include spring means.

8. The apparatus as set forth in claim 5
wherein said measurement element has a measurement tip adapted to be brought into contact with the contact of the connecting element.

9. The apparatus as set forth in claim 5 and further comprising a second measurement line and means electrically conductively connecting the second measurement line to the measurement unit and to the junction elements.

10. The apparatus as set forth in claim 9
wherein the connecting lines and the first and second measurement lines are respectively combined together to form a cable loom.

11. A method of measuring a welding voltage at a heating coil of a heating coil fitting which includes connecting elements for connection to a welding current supply unit by way of connecting lines and junction elements, the welding voltage being taken off at a respective contact of each of the two connecting elements of the heating coil fitting electrically insulatedly from the connecting lines and the junction elements, the welding voltage being detected by means of a measurement device having measurement elements which are reversibly acted upon by a force in the direction of the contact of the connecting elements; and a further voltage value being taken off at the connecting lines;

wherein measurement is effected at least approximately in a current-less mode.

12. A heating coil welding apparatus comprising:

at least one welding current supply unit, at least first and second lines for connecting to the welding current supply unit, with the connecting lines each having a junction element;

a measurement unit for detecting at least the welding voltage, at least one heating coil fitting including connecting elements, the connecting elements each being releasably connectable to the welding current supply unit by way of said connecting lines;

each junction element having at least one measurement element for connection to a first measurement line from the measurement unit and operable to be brought into electrically conductive contact with a contact of a connecting element of the heating coil fitting to detect the welding voltage in electrically insulated relationship from the connecting line and the junction element, each said measurement element having a measurement tip for contacting the connecting element;

spring means for urging the measurement element towards the contact of the connecting element a second measurement line and means electrically conductively connecting the second measurement line to the measurement unit and to the junction elements;

wherein the connecting lines and the first and second measurement lines are respectively combined together to form a cable loom.

* * * * *